United States Patent
Devereaux et al.

(10) Patent No.: US 12,438,050 B2
(45) Date of Patent: Oct. 7, 2025

(54) ELECTRONIC DEVICE FABRICATION USING AREA-SELECTIVE DEPOSITION

(71) Applicant: Applied Materials, Inc., Santa Clara, CA (US)

(72) Inventors: Zachary J. Devereaux, Webberville, MI (US); Bhaskar Jyoti Bhuyan, Santa Clara, CA (US); Thomas Joseph Knisley, Livonia, MI (US); Zeqing Shen, San Jose, CA (US); Susmit Singha Roy, Campbell, CA (US); Mark J. Saly, Santa Clara, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 422 days.

(21) Appl. No.: 18/109,365

(22) Filed: Feb. 14, 2023

(65) Prior Publication Data
US 2024/0282632 A1    Aug. 22, 2024

(51) Int. Cl.
| | |
|---|---|
| *H01L 21/768* | (2006.01) |
| *C23C 16/04* | (2006.01) |
| *C23C 16/32* | (2006.01) |
| *C23C 16/40* | (2006.01) |
| *C23C 16/455* | (2006.01) |
| *H01L 21/02* | (2006.01) |

(52) U.S. Cl.
CPC ...... *H01L 21/76897* (2013.01); *C23C 16/042* (2013.01); *C23C 16/32* (2013.01); *C23C 16/402* (2013.01); *C23C 16/45527* (2013.01); *H01L 21/02126* (2013.01); *H01L 21/02164* (2013.01); *H01L 21/0228* (2013.01); *H01L 21/02304* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 2008/0119016 A1 | 5/2008 | Dubin et al. | |
| 2009/0181178 A1 | 7/2009 | Edelstein et al. | |
| 2018/0233350 A1* | 8/2018 | Tois | H01L 21/321 |

(Continued)

OTHER PUBLICATIONS

International Search Report and Written Opinion for International Application No. PCT/US2024/015576, mailed Jun. 10, 2024, 9 Pages.

(Continued)

*Primary Examiner* — Asok K Sarkar
(74) *Attorney, Agent, or Firm* — Lowenstein Sandler LLP

(57) ABSTRACT

A method includes selectively forming at least one passivation layer on at least one first conductive layer disposed in a first interlevel dielectric (ILD) layer, selectively forming at least one catalyst layer on the at least one passivation layer, wherein the at least one passivation layer prevents formation of the at least one catalyst layer on the first conductive layer, and selectively forming at least one supplemental dielectric layer using the at least one catalyst layer. The at least one catalyst layer induces formation of the at least one supplemental dielectric layer, and the at least one supplemental dielectric layer includes a dielectric material having a dielectric constant of less than or equal to about 4.

20 Claims, 8 Drawing Sheets

(56) References Cited

U.S. PATENT DOCUMENTS

| | | | |
|---|---|---|---|
| 2019/0148144 A1* | 5/2019 | Liu | C23C 16/00 257/632 |
| 2021/0301394 A1 | 9/2021 | Illiberi et al. | |
| 2022/0130659 A1 | 4/2022 | Wang et al. | |
| 2022/0130664 A1 | 4/2022 | Wang et al. | |

OTHER PUBLICATIONS

Liu, Tzu-Ling, et al., "Area-Selective Atomic Layer Deposition on Chemically Similar Materials: Achieving Selectivity on Oxide/Oxide Patterns", https://dx.doi.org/10.1021/acs.chemmater.0c03227, Chem. Mater. 2021, 33, 513-523, Downloaded via Applied Materials Inc on Jun. 21, 2022 at 18:07:34 (UTC).

Burton, B.B., et al., Department of Chemistry and Biochemistry and Department of Chemical and Biological Engineering, University of Colorado, Boulder, Colorado 80309, and SAFC Hitech, Sheboygan Falls, Wisconsin 53085, "Rapid $SiO_2$ Atomic Layer Deposition Using Tris(tert-pentoxy)silanol", Chem. Mater. 2008, 20, 7031-7043, Downloaded via Applied Materials Inc on Apr. 1, 2022 at 21:59:02 (UTC).

Hausmann, Dennis, et al., "Rapid Vapor Deposition of Highly Conformal Silica Nanolaminates", Oct. 11, 2002, vol. 298 Science, www.sciencemag.org, 5 pages.

Torras, Juan, et al., "How Organophosphonic Acid Promotes Silane Deposition onto Aluminum Surface: A Detailed Investigation on Adsorption Mechanism", Jul. 17, 2014, https://pubs.acs.org/doi/10.1021/jp5046707, 37 pages.

Gelest Inc, "Self-Assembled Monolayers (SAMs)", https://www.gelest.com/applications/case-coatings-adhesives-sealants-and-elastomers/self-assembled-monolayers/#:~: text=A%20self%2Dassembled%20monolayer%20(SAM,chlorosilanes%20or%20alkoxysilanes%20are%20used, May 20, 2022, 5 pages.

\* cited by examiner

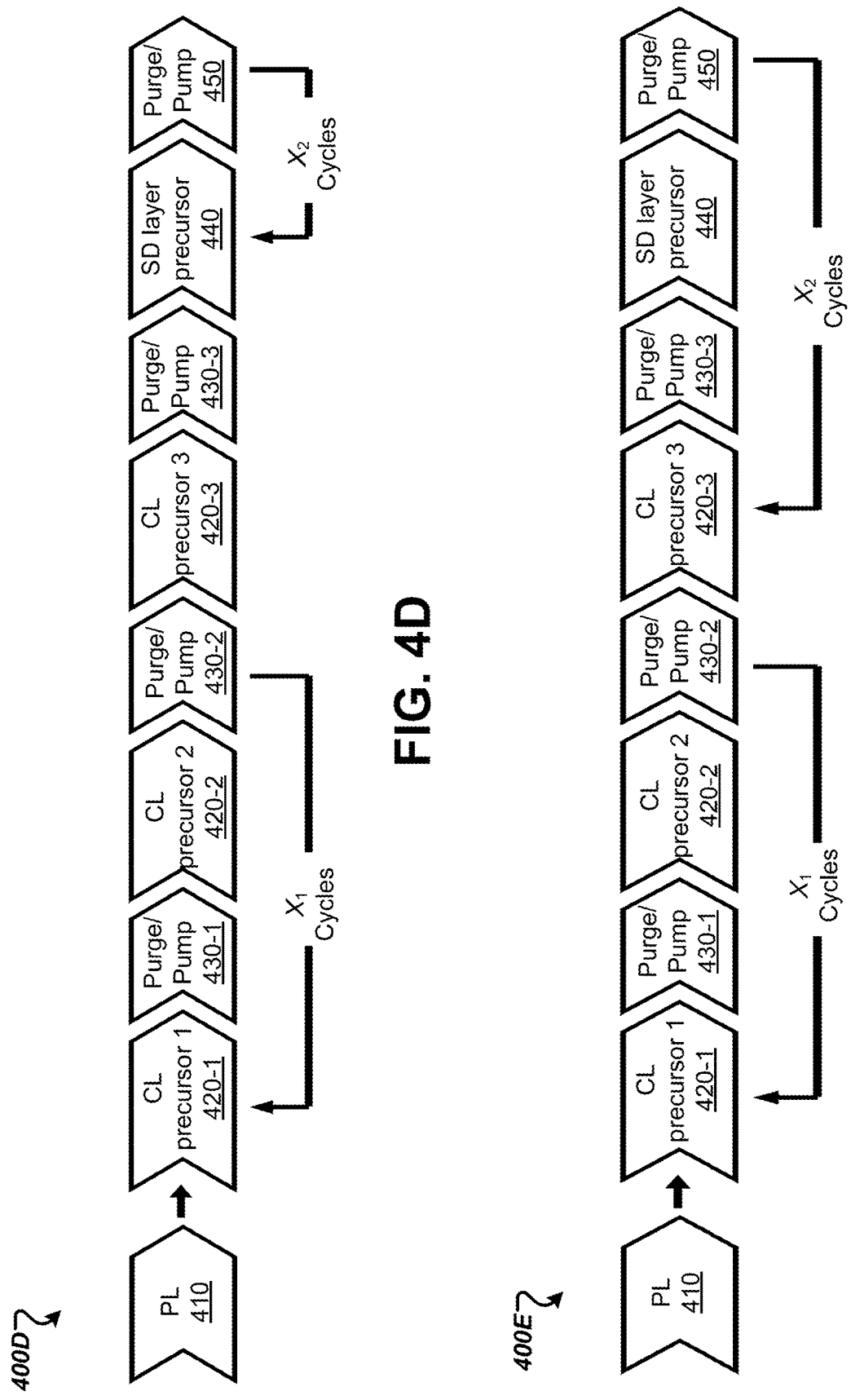

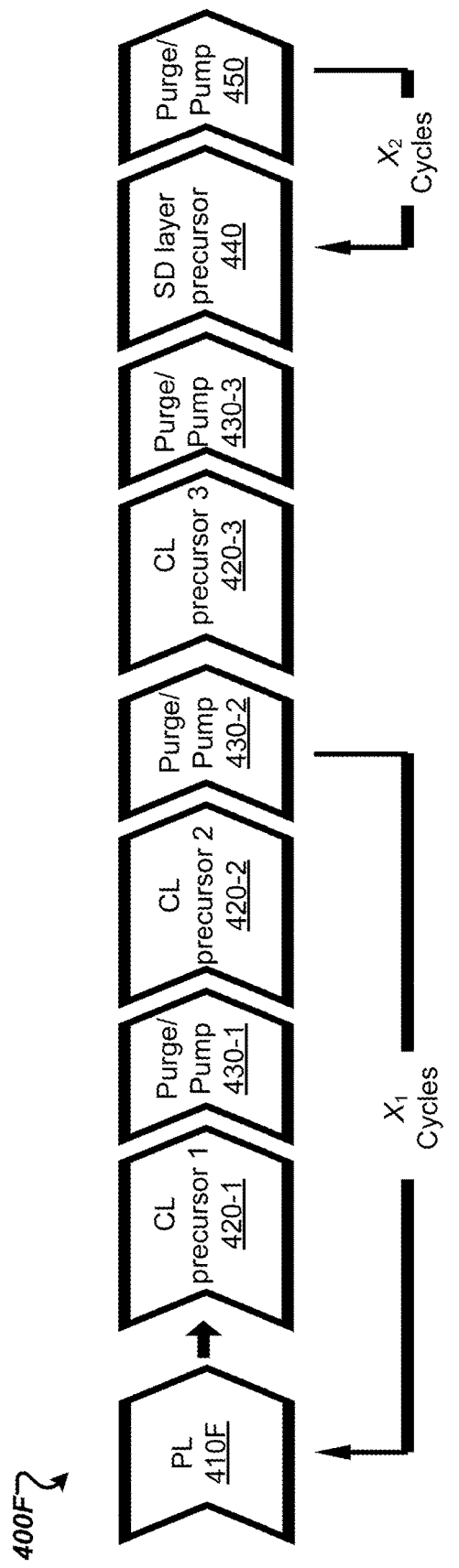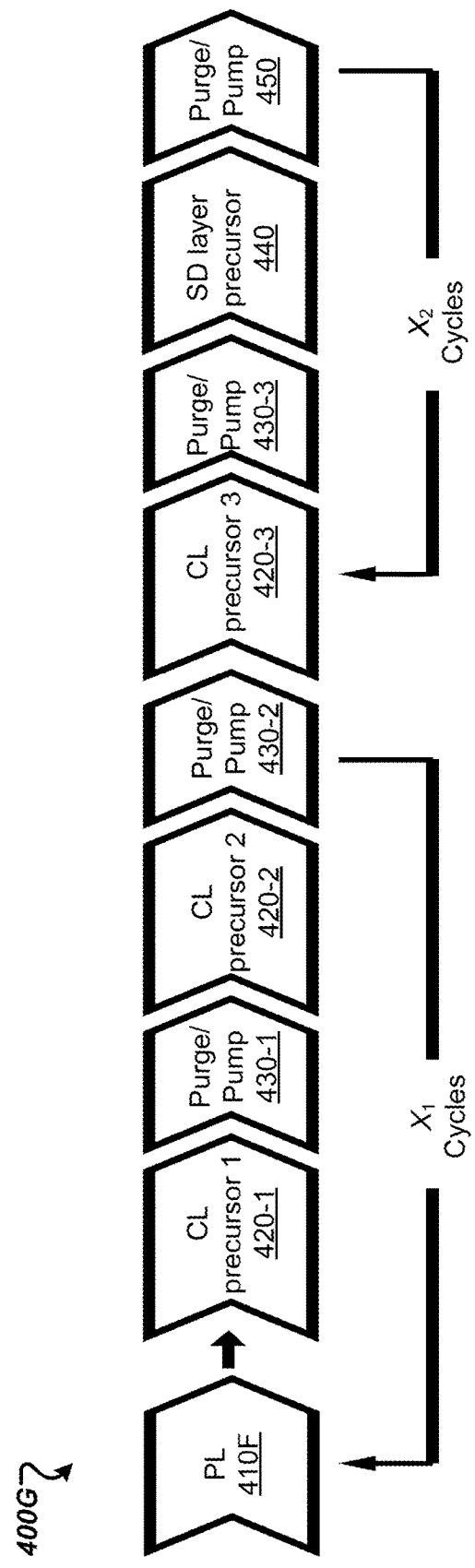

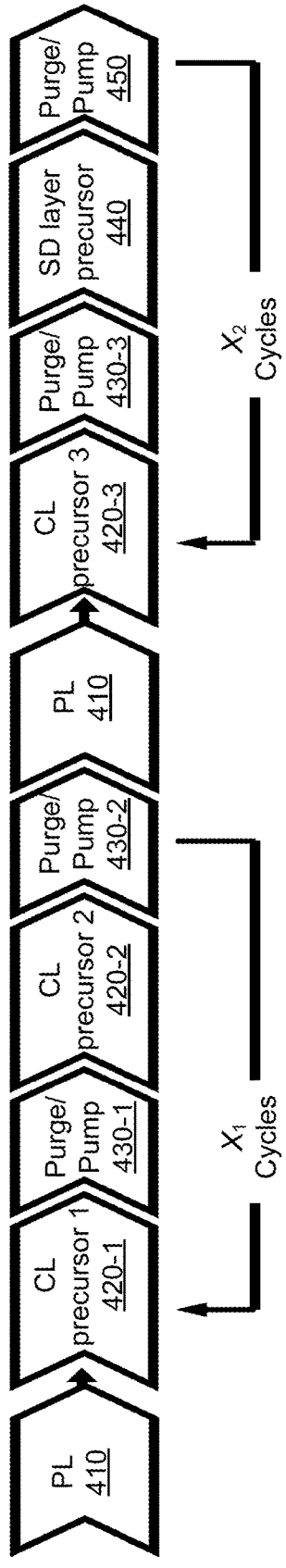
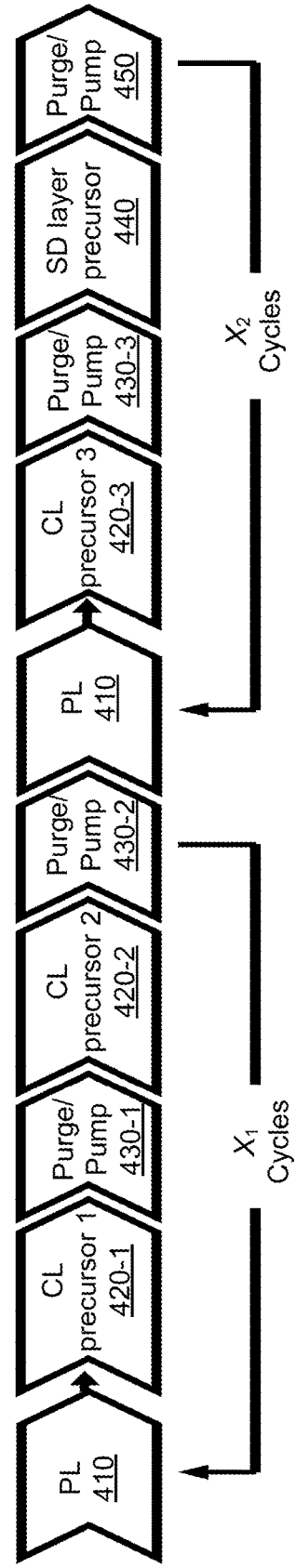
FIG. 4H
FIG. 4I

ELECTRONIC DEVICE FABRICATION USING AREA-SELECTIVE DEPOSITION

TECHNICAL FIELD

Embodiments of the present disclosure generally relate to electronic device fabrication. Particularly, embodiments of the present disclosure relate to electronic device fabrication using area-selective deposition.

BACKGROUND

An electronic device manufacturing apparatus can include multiple chambers, such as process chambers and load lock chambers. Such an electronic device manufacturing apparatus can employ a robot apparatus in transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gasses are flowed into the process chamber.

Electronic devices, such as semiconductor devices, are manufactured by performing a series of operations that may include deposition, oxidation, photolithography, ion implantation, etch, and so on to form many patterned layers. Often, it is beneficial to align features between layers. Misalignment of features (e.g., due to lithography and/or patterning limitations) in some instances may lead to shorting and/or capacitive coupling between, for example, vias and underlying conductive lines. Such shorting and/or capacitive coupling can impair the functioning of the manufactured electronic devices.

SUMMARY

In accordance with an embodiment, a method is provided. The method includes selectively forming at least one passivation layer on at least one first conductive layer disposed in a first interlevel dielectric (ILD) layer, selectively forming at least one catalyst layer on the at least one passivation layer, wherein the at least one passivation layer prevents formation of the at least one catalyst layer on the first conductive layer, and selectively forming at least one supplemental dielectric layer using the at least one catalyst layer. The at least one catalyst layer induces formation of the at least one supplemental dielectric layer, and the at least one supplemental dielectric layer includes a dielectric material having a dielectric constant of less than or equal to about 4.

In accordance with an embodiment, a system is provided. The system includes at least one chamber operatively coupled to at least one store. The at least one chamber is configured to selectively form at least one passivation layer on at least one first conductive layer disposed in a first interlevel dielectric (ILD) layer, selectively form at least one catalyst layer on the at least one passivation layer, wherein the at least one passivation layer prevents formation of the at least one catalyst layer on the first conductive layer, and selectively form at least one supplemental dielectric layer using the at least one catalyst layer. The at least one catalyst layer induces formation of the at least one supplemental dielectric layer, and the at least one supplemental dielectric layer includes a dielectric material having a dielectric constant of less than or equal to about 4.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1A:
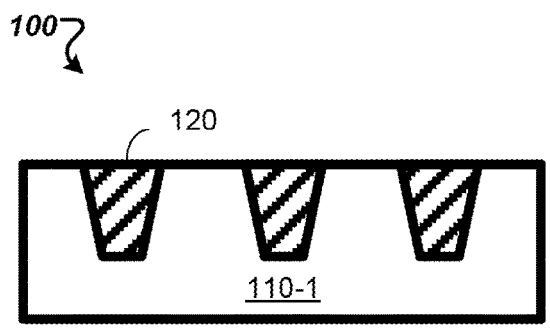
FIGS. 1A-1F are cross-sectional views illustrating an example method of fabricating an electronic device using area-selective deposition, in accordance with some embodiments.

Embodiments described herein relate to electronic device fabrication using area-selective deposition. An electronic device can include dielectric material and conductive layers. For example, an electronic device can include a dielectric layer, and a number of conductive layers disposed in (e.g., within) the dielectric layer. More specifically, an electronic device can include a number of metallization levels, where each metallization level includes a respective set of conductive layers, and each pair of metallization levels is separated by a respective dielectric layer (e.g., interlevel dielectric (ILD) layer). Each conductive layer can be formed within a respective trench.

For example, a conductive layer can be a via. A via refers to an electrical connection, or contact, between conductive lines within an electronic device. Each via can function as a respective interconnect between at least two metallization levels. For example, a through via is a via that is exposed at both ends of the device (i.e., the through via is formed through each metallization level from the top of the device to the bottom of the device). As another example, a buried via is a via that is exposed at neither end of the device (i.e., the buried via functions as an interconnect between internal metallization levels). As yet another example, a blind via is a via that is exposed at a single end of the device.

Electronic device processing techniques can involve performing patterning (e.g., photolithography). For example, patterning can include multiple and repetitive processes of deposition and etching, such as wet etching or dry etching (e.g., plasma etching), with photomasks ("masks") and resist films. Illustratively, conductive lines and vias can be formed using a suitable patterning process. For example, conductive lines and vias can be formed using a single damascene process, during which a conductive line and a via are formed sequentially. As another example, conductive lines and vias can be formed using a dual damascene process, during which a conductive line and a via can be formed simultaneously (e.g., by simultaneously filling both the via hole and the trench with conductive material). The conductive lines and vias can include any suitable conductive material (e.g., metal).

In an example, assume that a device includes a first metallization level including a first via disposed in a ILD layer. To pattern a second via of a second metallization level above the first metallization level, dielectric material including a second ILD layer can be formed across the first metallization level using any suitable deposition process(es). The dielectric material can further include a dielectric cap, which can be deposited across the first metallization level. The second ILD layer can be etched to form a trench. The dielectric cap can function as an etch stop layer to define the bottom of the trench. A via opening can include the trench. For example, a portion of the dielectric cap can be removed to expose the first via using an etch process (e.g., anisotropic etch process). Conductive material can be formed within the via opening to form the second via.

If the second via has substantially correct edge placement with respect to the first via (e.g., the via is centered with respect to the first via), then second via can be considered as an aligned via. However, as electronic devices scale down in size (e.g., as transistor sizes decrease), process variations can result during lithography/patterning (e.g., nanoscale patterning). One example of a process variation is mask misalignment between the mask and the patterned substrate. During exposure to light the mask misalignment can result in edge placement error equal to the distance between the target position of an edge of a feature and the actual position of the edge of the feature. Edge placement errors can cause detrimental effects that can lead to decreased device performance, such as shorts, increased resistance, capacitive coupling, etc. In the above example, mask misalignment during the initial patterning of the trench within the second ILD layer can lead to misalignment of the second via with respect to the first via. In particular, an edge placement error can result with respect to an edge of the second via. Thus, during the formation of the via, an edge of the second via can be formed on a portion of the dielectric layer in a region between its corresponding conductive line and another adjacent conductive line).

Such via misalignment (i.e., edge placement error) can lead to shorting or capacitive coupling between the first and second vias, which can be a function of the horizontal spacing between the first and second vias (e.g., a distance between the upper surface of the first via and the lower surface of the second via). The effects of via misalignment can become more pronounced as transistor sizes become smaller (e.g., on the nanometer (nm) scale). Accordingly, as transistor device sizes scale further downward, it is important to maintain a minimum amount of spacing to prevent shorting or capacitive coupling due to process variations that result in via misalignment.

In some implementations, a fully self-aligned via (FSAV) process can be employed to address via misalignment (i.e., edge placement errors). One example of an FSAV process employs a recess method. During the recess method, after trenches within the first ILD layer are filled with a conductive material (e.g., metal) to form, e.g., the first via, the conductive material can be recessed to a particular depth within their respective trenches using an etch process. The second via can then be formed such that the upper surface of the first via is located below the upper surface of the first ILD layer. Thus, if the second via is misaligned with respect to the first via, then the second via can have an edge, formed on the dielectric layer, that is located at some distance above the upper surface of the first via. This can cause the upper surface of the first via and the lower surface of the second via to be separated by a diagonal spacing. The diagonal spacing is a function of the horizontal spacing described above, as well as a vertical distance between the upper surface of the first via and the lower surface of the second via. That is, the diagonal spacing has a greater length than the horizontal spacing, which can help prevent shorting or capacitive coupling.

However, the recess method suffers from a number of drawbacks. For example, the recess method can exhibit poor uniformity over a wafer and across different pitch sizes, high conductive line surface roughness, and material degradation. Moreover, it may be difficulty to etch some conductive materials to achieve the recessing of, e.g., the first via (e.g., Cu etching can be challenging).

Another example of a method that can be used to address process variations such as via misalignment is an area-selective deposition method. More specifically, the selective material deposition approach can include a dielectric-on-dielectric (DoD) selective deposition approach. For example, after trenches within the first ILD layer are filled with conductive material to form, e.g., the first via as described above, a supplemental dielectric layer can be selectively deposited on the exposed upper surfaces of the first ILD layer in preference to the first conductive material. Selectivity can be defined as, for example, the ratio of the film thickness (e.g., the thickness of the supplemental dielectric layer) on the target surface (e.g., the first ILD layer) to the film thickness on the non-target surface (e.g., the conductive material). Other definitions of selectivity can be used. The supplemental dielectric layer can be formed to a height similar in magnitude to the depth achieved during the recess method described above. Similar to the recess method, if the second via is formed to be misaligned with respect to the first via, then the second via can have an edge, formed on the supplemental dielectric layer, that is located at some distance above the upper surface of the first via. Similar to the recess method, the area-selective deposition method can cause the upper surface of the first via and the lower surface of the second via to be separated by a diagonal spacing having a length that is greater than the horizontal spacing, which can help prevent shorting or capacitive coupling.

It may be beneficial to form supplemental dielectric layers with relatively lower dielectric constants (i.e., low-k dielectric materials). For example, a low-k dielectric material can have a dielectric constant of less than or equal to about 4. However, area-selective deposition methods are typically limited to forming supplemental dielectric layers with relatively higher dielectric constants (i.e., high-k dielectric materials). Examples of such high-k dielectric materials include zinc oxide (ZnO), aluminum oxide ($Al_2O_3$), etc. Moreover, achieving greater than 10 nanometer (nm) selectivity on dielectric materials versus conductive materials (e.g., metals) has been challenging using conventional techniques.

To address these and other drawbacks, embodiments described herein can be used to fabricate electronic devices using area-selective deposition. Embodiments described herein can be used to form an electronic device including at least one supplemental dielectric layer to address misalignment (e.g., via misalignment). More specifically, the at least one supplemental dielectric layer can be formed using an area-selective dielectric-on-dielectric (DoD) approach. In some embodiments, area-selective deposition achieves FSAV leakage control with respect to vias formed during an FSAV process.

In an example, forming an electronic device can include obtaining a base structure including at least one conductive layer disposed in (e.g., within) a first ILD layer. For example, the at least one conductive layer can include a first via. The at least one conductive layer and the first ILD layer can form at least a portion of a first metallization level of the device. Examples of suitable conductive materials that can be used to form the at least one conductive layer include copper (Cu), tungsten (W), cobalt (Co), molybdenum (Mo), ruthenium (Ru), titanium nitride (TiN), tantalum nitride (TaN), molybdenum nitride ($MoN_x$), etc.

Forming the electronic device can further include selectively forming at least one supplemental dielectric layer on the first ILD layer. More specifically, each supplemental dielectric layer can formed on the first ILD layer in preference to the at least one conductive layer of the base structure (i.e., DoD selective deposition). In some embodiments, selectively forming the at least one supplemental dielectric layer includes selectively forming a passivation layer on the first conductive material, selectively forming at least one catalyst layer on the first ILD layer, and selectively forming the at least one supplemental dielectric layer using the at least one catalyst layer. More specifically, each catalyst layer can be formed using one or more catalyst layer precursors, and each passivation layer can include a material that can block the formation of each catalyst layer using the one or more catalyst layer precursors. In some embodiments, each supplemental dielectric layer includes a low-k dielectric material. For example, each supplemental dielectric layer can include a dielectric material having a dielectric constant of less than or equal to about 4.

Each catalyst layer is used to induce formation of each supplemental dielectric layer. For example, each catalyst layer can be used to achieve a suitably high growth per cycle (GPC) of a deposition process used to form each supplemental dielectric layer (e.g., catalyze growth). Each catalyst layer can include a suitable chemistry to induce the formation of each supplemental dielectric layer. For example, each catalyst layer can include a strong reducing agent, a metal hydride, a metal alkyl, a metal aryl, a silane, etc. Each catalyst layer can be formed using one or more catalyst layer precursors. In some embodiments, each catalyst layer is a metal-catalyst layer. In some embodiment, each catalyst layer is a metalloid-catalyst layer. For example, a catalyst layer can be an aluminum (Al)-catalyst layer, a titanium (Ti)-catalyst layer, a hafnium (Hf)-catalyst layer, a zirconium (Zr)-catalyst layer, a tantalum (Ta)-catalyst layer, a boron (B)-catalyst layer, a germanium (Ge)-catalyst layer, a tin (Sn)-catalyst layer, a gallium (Ga)-catalyst layer, an indium (In)-catalyst layer, etc. As an illustrative example, an Al-catalyst layer can include $Al_2O_3$ and the one or more catalyst layer precursors can include one or more of trimethylaluminum (TMA), tris(neopentyl)aluminum, etc.

Each catalyst layer and each supplemental dielectric layer can be formed by performing any suitable number of cycles of respective deposition processes to form each supplemental dielectric layer to have a target thickness. In some embodiments, a deposition process is an atomic layer deposition (ALD) process. In some embodiments, a deposition process is a thermal ALD process. A thermal ALD process is an ALD process that uses thermal energy to proceed. In some embodiments, the target thickness between about 5 nm to about 30 nm. In some embodiments, the target thickness is between about 10 nm to about 20 nm.

In some embodiments, selectively forming each supplemental dielectric layer includes refreshing each passivation layer after selectively forming each catalyst layer, and selectively forming each supplemental dielectric layer using each catalyst layer after refreshing each passivation layer. In some embodiments, selectively forming each supplemental dielectric layer includes refreshing each passivation layer after selectively forming each supplemental dielectric layer on each catalyst layer. Refreshing each passivation layer can be done to further improve the selectivity of the catalyst layer and/or the supplemental dielectric layer.

Forming the electronic device can further include forming a second ILD layer on the base structure and each supplemental dielectric layer, forming at least one opening within the second ILD layer, and forming at least one conductive layer within the at least one opening. The at least one conductive layer formed within the at least one opening and the second ILD layer can form at least a portion of a second metallization level of the electronic device. For example, the at least one conductive layer formed within the at least one opening can include a second via formed in contact with the first via. In the event that the second via is misaligned with respect to the first via, a corresponding supplemental dielectric layer can increase the diagonal distance between the first via and the second via. Accordingly, the supplemental dielectric layer can reduce or eliminate effects related to shorting or capacitive coupling between the first via and the second via. Additional device processing steps may be performed to complete the formation of the electronic device. Further details regarding forming the electronic device, including selectively forming each supplemental dielectric layer, will be described below with reference to FIGS. 1A-5.

FIGS. 1A-IF are cross-sectional views illustrating an example method of forming an electronic device ("device") 100 using area-selective deposition, in accordance with some embodiments. As shown in FIG. 1A, base structure 102 is obtained. Base structure 102 includes an ILD layer 110-1 and conductive layers including conductive layer 120 disposed in (e.g., within) ILD layer 110-1. For example, obtaining base structure 102 can include forming base structure 102. Forming base structure 102 can include forming a plurality of trenches within ILD layer 110-1, and forming conductive material within respective trenches of the plurality of trenches to form the conductive layers including conductive layer 120. ILD layer 110-1 and the conductive layers including conductive layer 120 can define a first metallization level of device 100. Although not shown in FIG. 1A, base structure 102 can further include a substrate layer as an initial layer of device 100 (e.g., a semiconductor wafer), and the first metallization level can be formed on the substrate layer. For example, the substrate layer can be a Si substrate layer. In some embodiments, the first metallization level is formed directly on the substrate layer. In some embodiments, one or more intervening layers (e.g., one or more metallization levels) are disposed between the first metallization level and the substrate layer.

Although not shown, base structure 102 can include one or more additional layers, such that ILD layer 110-1 and the conductive layers including conductive layer 120 are disposed on the one or more additional layers. For example, device 100 can further include at least a substrate layer (e.g., silicon (Si)) substrate) (not shown) as an initial layer of the device.

ILD layer 110-1 can include any suitable dielectric material. In some implementations, the ILD layer 110-1 can include an oxide (e.g., a metal oxide). Examples of suitable dielectric materials include $SiO_2$, carbon-doped silicon oxides (e.g., SiOC, SiCOH), etc. The conductive layers including conductive layer 120 can include any suitable conductive material (e.g., metal). In some embodiments, the conductive layers include a conductive material including a transition metal. Examples of suitable conductive materials that can be used to form the conductive layers including conductive layer 120 include Cu, W, Co, Mo, Ru, TiN, TaN, MoN$_x$, etc.

Figure 1B:
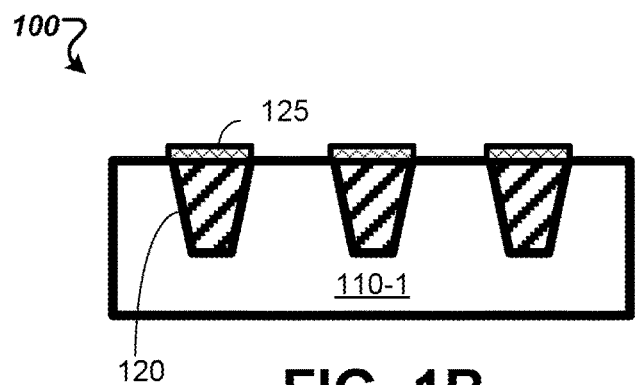

As shown in FIG. 1B, passivation layers including passivation layer 125 are selectively formed on respective ones of the conductive layers. For example, passivation layer 125 can adsorb to the upper surface of conductive layer 120, in preference to the upper surface of ILD layer 110-1. The passivation layers including passivation layer 125 can include a material that is selected to enable the selective formation of catalyst layers and/or supplemental dielectric layers on ILD layer 110-1 during a subsequent deposition process. Catalyst layers can be used to induce the formation (e.g., catalyze growth) of the supplemental dielectric layers, as will be described in further detail below. More specifically, the passivation layers including passivation layer 125 can include a material that is selected to prevent (e.g., block) the adsorption of catalyst layer precursors during a deposition process to form the catalyst layers and/or block the adsorption of supplemental dielectric layer precursors during a deposition process to form the supplemental dielectric layers (i.e., prevent nucleation of the deposition precursors on the first conductive material). In some embodiments, and as will be described in further detail below, the deposition process to form the supplemental dielectric layers is an atomic layer deposition (ALD) process. For example, the ALD process can be a thermal ALD process. Accordingly, the passivation layers including passivation layer 125 can prevent (e.g., block) the formation of catalyst layers and/or supplemental dielectric layers on the conductive layers including conductive layer 125. Further details regarding selectively forming the passivation layers including passivation layer 125 will be described below with reference to FIGS. 2-5.

Figure 1C:
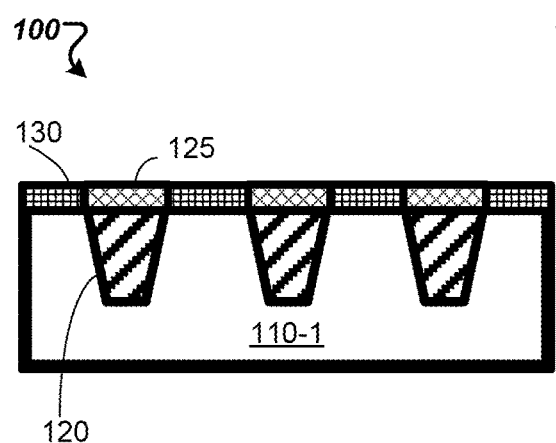

As shown in FIG. 1C, after selectively forming the passivation layers including passivation layer 125 (and optional precleaning), catalyst layers including catalyst layer 130 are selectively formed on ILD layer 110-1. The passivation layers including passivation layer 125 prevent (e.g., block) the adsorption of catalyst precursors used to form the catalyst layers including catalyst layer 130. Further details regarding selectively forming the catalyst layers including catalyst layer 130 will be described below with reference to FIGS. 2-5.

Figure 1D:
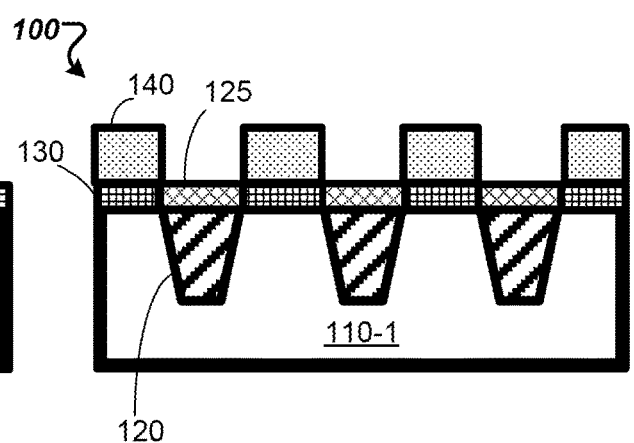

As shown in FIG. 1D, supplemental dielectric layers including dielectric layer 140 are selectively formed on the catalyst layers including catalyst layer 130. Selectively forming the supplemental dielectric layers including dielectric layer 140 can include depositing a dielectric material using a deposition process. In some embodiments, the deposition process is an ALD process. For example, the ALD process can be a thermal ALD process. Other deposition processes may also be performed to produce the supplemental dielectric layers including dielectric layer 140. As described above, the catalyst layers including catalyst layer 130 are used to induce formation (e.g., catalyze growth) of the supplement dielectric layers including dielectric layer 140.

The supplemental dielectric layers including dielectric layer 140 can include any suitable dielectric material. In some embodiments, the supplemental dielectric layers including dielectric layer 140 can include a low-k dielectric material. For example, the supplemental dielectric layers including dielectric layer 140 can include a dielectric material having a dielectric constant of less than or equal to about 4. In some embodiments, the supplemental dielectric layers including dielectric layer 140 include a silicate (i.e., a material including silicon (Si) and oxygen (O)). Examples of suitable dielectric materials that can be included in the supplemental dielectric layers including dielectric layer 140 include SiO$_x$, SiOC, etc. The supplemental dielectric layers including dielectric layer 140 can be formed to have a target thickness. In some embodiments, the thickness of the supplemental dielectric layers including dielectric layer 140 is between about 5 nm to about 30 nm. In some embodiments, the thickness of the supplemental dielectric layers including dielectric layer 140 is between about 10 nm to about 20 nm. Further details regarding selectively forming the supplemental dielectric layers including dielectric layer 140 will be described below with reference to FIGS. 2-5.

Figure 1E:
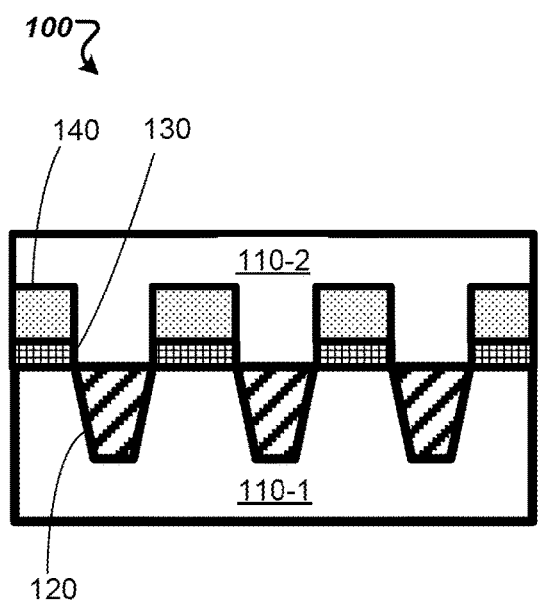

As shown in FIG. 1E, after selectively depositing the supplemental dielectric layers including dielectric layer 140 on ILD layer 110-1, ILD layer 110-2 can be formed. ILD layer 110-2 can include any suitable dielectric material. In some embodiments, ILD layer 110-2 includes an oxide. In some embodiments, ILD 110-2 includes a nitride. Examples of suitable dielectric materials include SiO$_2$, carbon-doped silicon oxides (e.g., SiOC, SiCOH), Si$_3$N$_4$, etc. In some embodiments, ILD layer 110-2 includes the same dielectric material as ILD layer 110-1. In some embodiments, ILD layer 110-2 includes a different dielectric material from ILD layer 110-1. Further details regarding forming ILD layer 110-2 will be described below with reference to FIG. 2.

Figure 1F:
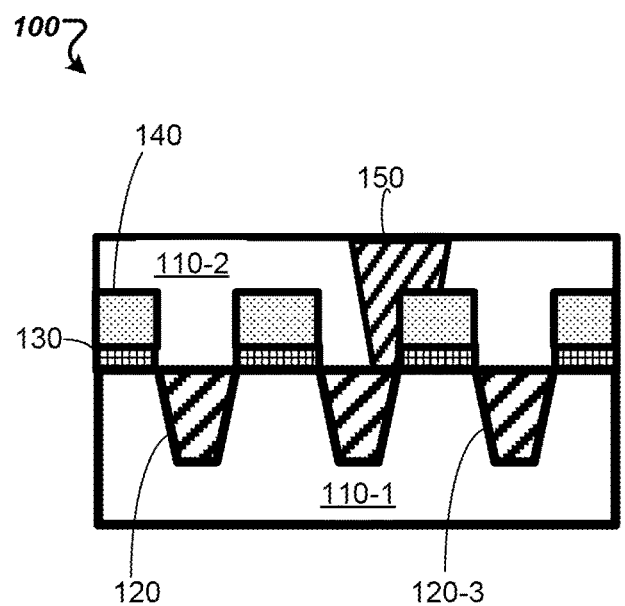

As shown in FIG. 1F, conductive layer 150 is formed in contact with conductive layer conductive layer 120. Forming conductive layer 150 can include forming an opening (e.g., via opening) within the ILD layer 110-2, and forming conductive material within the opening to form conductive layer 150. Conductive layer 150 can include any suitable conductive material (e.g., metal). In some embodiments, conductive layer 150 includes a transition metal. Examples of suitable conductive materials that can be used to form conductive material 150 include Cu, W, Co, Mo, Ru, etc. In some embodiments, conductive layer 150 can include the same material as conductive layer 120. In some embodiments, conductive material 150 can include a different material from conductive layer 120. Further details regarding forming conductive layer 150 will be described below with reference to FIG. 2.

In this example, conductive layer 150 is a second via that is misaligned with respect to the first via corresponding to conductive layer 120. More specifically, the second via has an edge that is disposed on dielectric layer 140 off-center with respect to the first via. A diagonal distance exists between the first via and the second via. The diagonal distance has a greater length than a horizontal distance defining the separation between the first via and the second via in the absence of dielectric layer 140. Therefore, the formation of dielectric layer 140 can enable FSAV leakage control to improve the performance of device 100 by reducing shorting or capacitive coupling between the first via and the second via. Further details regarding fabricating device 100 will now be described below with reference to FIG. 2.

Figure 2:
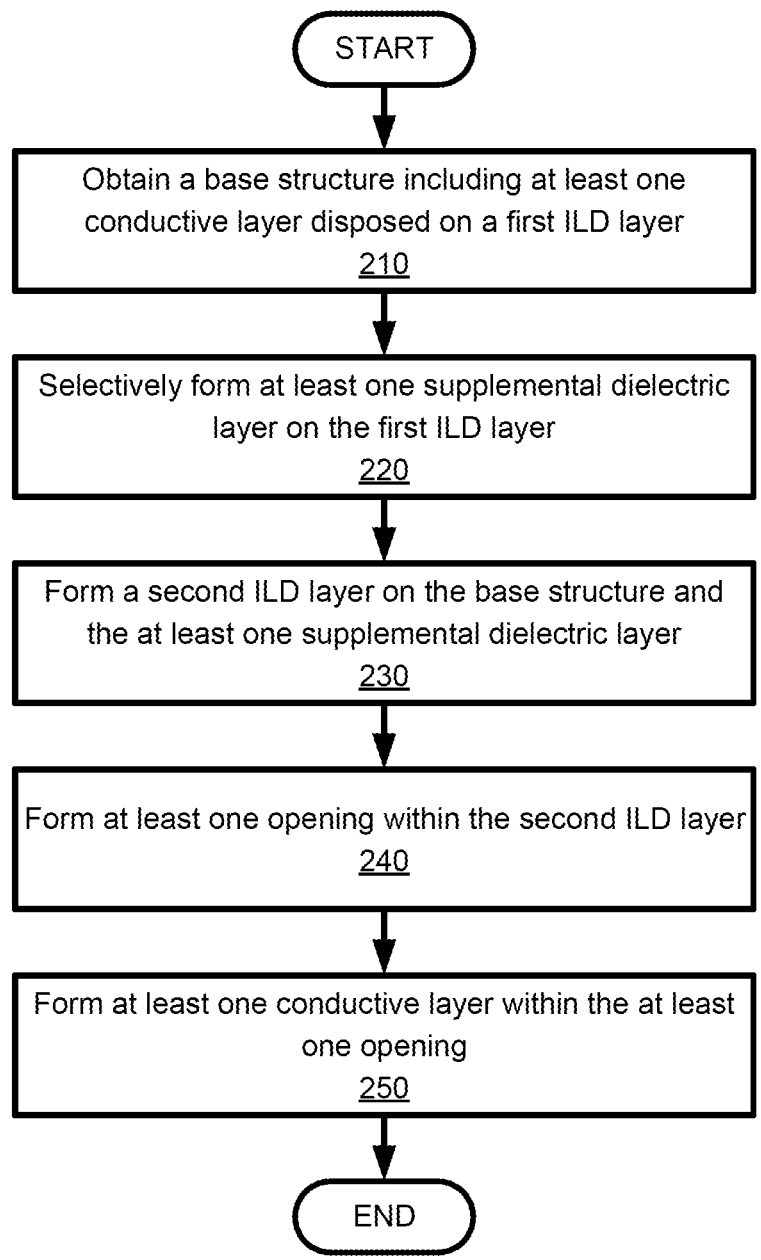
FIG. 2 is a flowchart of an example method of fabricating an electronic device using area-selective deposition, in accordance with some embodiments.

FIG. 2 depicts an example method 200 of fabricating an electronic device using area-selective deposition, in accordance with some embodiments. Method 200 can be performed within an electronic device processing system. More specifically, method 200 can be performed within one or more process chambers of the electronic device processing system. An example electronic device processing system will be described below with reference to FIG. 5.

At step 210, a base structure including at least one conductive layer disposed on a first ILD layer is obtained. In some embodiments, the at least one conductive layer of the base structure is disposed in (e.g., within) the first ILD layer. The at least one conductive layer includes a first conductive layer. For example, the first conductive layer can be a via. The first conductive material and the first ILD layer can collectively form at least a portion of a first metallization level of an electronic device. The first metallization level can be formed on a substrate layer as an initial layer of the base structure (e.g., Si substrate layer). In some embodiments, the first metallization level is formed directly on the substrate layer. In some embodiments, one or more intervening layers are disposed between the substrate layer and the first metallization level.

In some embodiments, obtaining the base structure includes receiving a preformed base structure. In some embodiments, obtaining the base structure include forming at least a portion of the base structure. For example, forming at least a portion of the base structure can include at least one of: forming the one or more intervening layers on the substrate layer, forming the first ILD layer on the substrate layer (e.g., directly on the substrate layer or on the one or more intervening layers), forming at least one opening (e.g., at least one trench) within the first ILD layer, or forming the conductive material within the at least one trench to form the at least one conductive layer including the first conductive layer.

The first ILD layer can include any suitable dielectric material. In some embodiments, the first ILD layer includes a first silicate. For example, the first ILD layer can include $SiO_2$. The first conductive material can include any suitable conductive material (e.g., metal). In some embodiments, the at least one conductive layer of the base structure includes a transition metal. Examples of suitable conductive materials that can be used to form the at least one conductive layer of the base structure include Cu, W, Co, Mo, Ru, TiN, TaN, $MoN_x$, etc.

At step 220, at least one supplemental dielectric layer is selectively formed on the first ILD layer. In some embodiments, the at least one supplemental dielectric layer includes a low-k dielectric material. In some embodiments, the low-k dielectric material has a dielectric constant of less than or equal to about 4. In some embodiments, the first ILD layer includes a first silicate (e.g., $SiO_2$) and the supplemental dielectric layer includes a second silicate. For example, the first silicate can include a silicon oxide ($SiO_x$) and the second silicate can be a low-k dielectric silicate (i.e., a silicate with a dielectric constant of less than or equal to about 4). Examples of low-k dielectric silicates include $SiO_x$, silicon oxycarbide (SiOC), etc. The at least one supplemental dielectric layer can be formed to have a target thickness. In some embodiments, the target thickness is between about 5 nm to about 30 nm. In some embodiments, the target thickness is between about 10 nm to about 20 nm. In some embodiments, selectively forming the at least one supplemental dielectric layer includes employing at least one catalyst layer to induce the formation of the at least one supplemental dielectric layer. In some embodiments, selectively forming the at least one supplemental dielectric layer includes selectively forming at least one passivation layer on the at least one conductive layer of the base structure, selectively forming at least one catalyst layer on the ILD layer of the base structure, and selectively forming the at least one supplemental dielectric layer on the at least one catalyst layer. More specifically, the at least one passivation layer can include a material that is selected to prevent (e.g., block) the adsorption of deposition precursors during the formation of the at least one catalyst layer and/or deposition precursors during the formation of the at least one supplemental dielectric layer.

Each catalyst layer can include a suitable chemistry to induce the formation of each supplemental dielectric layer. For example, each catalyst layer can include a strong reducing agent, a metal hydride, a metal alkyl, a metal aryl, a silane, etc. Each catalyst layer can be formed using one or more catalyst layer precursors. In some embodiments, each catalyst layer is a metal-catalyst layer. In some embodiment, each catalyst layer is a metalloid-catalyst layer. For example, a catalyst layer can be an Al-catalyst layer, a Ti-catalyst layer, a Hf-catalyst layer, a Zr-catalyst layer, a Ta-catalyst layer, a B-catalyst layer, a Ge-catalyst layer, a Sn-catalyst layer, a Ga-catalyst layer, an In-catalyst layer, etc. As an illustrative example, an Al-catalyst layer can include $Al_2O_3$. Further details regarding selectively forming the at least one supplemental dielectric layer on the first ILD layer will be described below with reference to FIGS. 3-5.

At step 230, a second ILD layer is formed on the base structure and the at least one supplemental dielectric layer. The second ILD layer can include any suitable dielectric material. In some embodiments, the second ILD layer can include an oxide. In some embodiments, the second ILD layer can include a nitride. Examples of suitable dielectric materials that can be used to form the second ILD layer include $SiO_2$, carbon-doped silicon oxides (e.g., SiOC, SiCOH), $Si_3N_4$, etc. In some embodiments, the second ILD layer includes the same dielectric material as the first ILD layer). In some embodiments, the second ILD layer includes a different dielectric material from the first ILD layer.

At step 240, at least one opening is formed within the second ILD layer. More specifically, the at least one opening includes an upper surface of the second ILD layer to expose an upper surface of the first conductive material. Forming the at least one opening can include forming at least one trench within the second ILD layer. For example, forming the at least one trench can include performing an etch process. If the base structure does not include a dielectric cap including an etch stop layer formed on the first ILD layer, then at least one trench can be equivalent to the least one opening. Alternatively, if the base structure further includes the dielectric cap disposed on the first ILD layer, then the formation of the trench using the etch process may stop at the etch stop layer. Thus, forming the at least one opening can further include performing an additional etch process (e.g., anisotropic etch process) to remove the dielectric cap. In some embodiments, the at least one opening is a via opening. In some embodiments, the at least one opening is formed by drilling through the first ILD layer.

At step 250, at least one conductive layer is formed within the at least one opening. More specifically, the at least one conductive layer formed within the at least one opening can include a second conductive layer formed in contact with the first conductive layer. In some embodiments, the second conductive layer is a second via. The at least one conductive layer formed within the at least one opening can include any suitable conductive material (e.g., metal). Examples of suitable conductive materials that can be used to form the at least one conductive layer within the at least one opening include Cu, W, Co, Mo, Ru, TiN, TaN, $MoN_x$, etc. In some embodiments, the at least one conductive layer formed within the at least one opening includes the same material as the at least one conductive layer disposed on the first ILD layer. In some embodiments, the at least one conductive layer formed within the at least one opening includes a different material from the at least one conductive layer disposed on the first ILD layer. Further details regarding steps 210-250 are described above with reference to FIGS. 1A-1F and will now be described below with reference to FIGS. 3-5.

Figure 3:
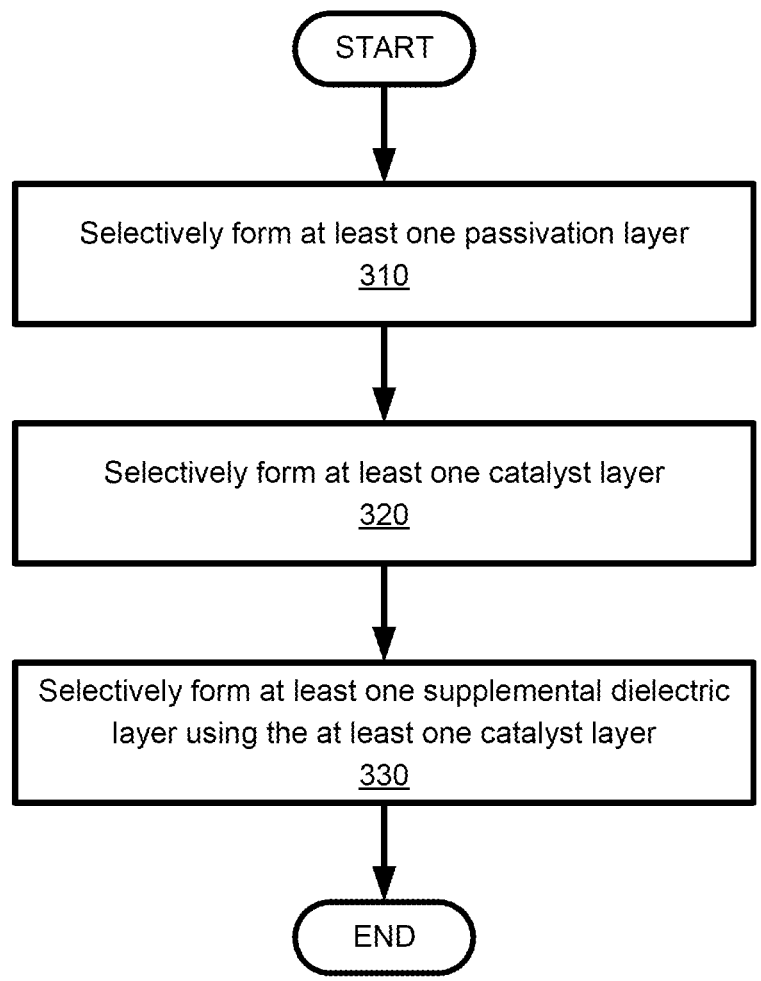
FIGS. 3-4I are diagrams of example methods of selectively forming at least one supplemental dielectric layer during fabrication of an electronic device, in accordance with some embodiments.

FIGS. 3-4I are diagrams illustrating example methods 300-400I of selectively forming at least one supplemental dielectric layer during fabrication of an electronic device, in accordance with some embodiments. For example, one or more of methods 300-400I can be used to implement step 220 of method 200 of FIG. 2. One or more of methods 300-400I can be performed within an electronic device processing system. More specifically, one or more of methods 300-400I can be performed within one or more process chambers of the electronic device processing system. An example electronic device processing system will be described below with reference to FIG. 5.

FIG. 3 is a flow diagram illustrating example method 300 of selectively forming at least one supplemental dielectric layer during fabrication of an electronic device. At step 310, at least one passivation layer is selectively formed. More specifically, the at least one passivation layer can be selectively formed on at least one conductive layer of a base structure, in preference to an ILD layer of the base structure, by performing a passivation process. For example, the at least one conductive layer of the base structure can be formed within the ILD layer of the base structure. In some embodiments, the at least one conductive layer of the base structure includes at least one via. In some embodiments, the at least one passivation layer is formed as a self-assembled monolayer (SAM). A SAM is a layer of material that has a single molecule thickness formed by surface adsorption (e.g., chemisorption) during a deposition process.

Performing the passivation process can include exposing the base structure to at least one passivant (i.e., passivating agent). The at least one passivant is chosen to selectively adsorb to the at least one conductive layer of the base structure, in preference to the ILD layer of the base structure. In some embodiments, the at least one passivant includes a vapor-phase passivant. For example, the at least one passivation layer can be formed as a SAM grown in vapor phase from at least one vapor-phase passivant. Examples of vapor-phase passivants that can be used to form the at least one passivation layer include amines (e.g., N-Ethylethylenediamine, N,N'-Diethylethylenediamine, N,N,N',N'-Tetraethylethylenediamine and N,N,N',N'-Tetramethylethylenediamine), silanes (e.g., dodecylsilane and N-Octylsilane), alkynes (e.g., 5-Decyne), alcohols (e.g., 2,5-Dimethyl-3-hexyne-2,5-diol), etc.

A vapor-phase passivant process to form the at least one passivation layer can be performed using any suitable process parameters. In some embodiments, the vapor-phase passivant process can be performed at a pressure between about 1 torr to about 10 torr. In some embodiments, the dose time per cycle can be between about 0.1 s to about 2 s. In some embodiments, the number of cycles can range from about 500 cycles to about 1,500 cycles.

In some embodiments, the at least one passivant includes a solution-phase passivant. For example, the at least one passivation layer can be formed as a SAM grown in solution phase from at least one solution-phase passivant. In some embodiments, the at least one solution-phase passivant is an organophosphorus compound (i.e., a phosphorous-containing organic compound). For example, the passivation layer can include an organophosphorus compound monolayer. In some embodiments, the organophosphorus compound is an organophosphonic acid. For example, the passivation layer can include an organophosphonic acid monolayer. One example of an organophosphonic acid is octadecylphosphonic acid (ODPA). ODPA can be represented by the molecular/empirical formula of $C_{18}H_{39}O_3P$ and a condensed structural formula of $CH_3(CH_2)_{16}CH_2P(O)(OH_2)$. For example, a solution-phase passivant can include a 1:10 millimolar (mM) solution of ODPA in toluene ($C_7H_8$). The base structure can be soaked in the solution for a length of time. For example, the length of time can be about 48 hours. A post-clean process (e.g., rinse) can be performed after the soaking.

The passivation process used to selectively form the at least one passivation layer on the at least one conductive layer of the base structure can be performed using any suitable process parameters. Examples of process parameters for performing the passivation process include temperature, passivant exposure time (e.g., time of exposure to the passivant), pressure, etc. In some embodiments, the passivation process is performed at a temperature between about 100° C. to about 350° C. In some embodiments, the passivation process is performed at a temperature between about 250° C. to about 350° C. At sufficiently high temperatures, passivation degradation can occur (e.g., temperatures exceeding 350° C.). Thus, the passivation process can be performed below a threshold temperature to maintain passivation layer quality (e.g., less than or equal to about 350° C.). In some embodiments, the passivation process is performed at a pressure between about 100 mTorr to about 10 torr. In some embodiments, the passivation process is performed at a pressure between about 500 mTorr to about 10 torr. In some embodiments, the passivation process is performed at a pressure between about 750 mTorr to about 10 torr. In some embodiments, the passivant exposure time is less than or equal to about 60 minutes. In some embodiments, the passivant exposure time is less than or equal to about 50 minutes. In some embodiments, the passivant exposure time is less than or equal to about 40 minutes. In some embodiments, the passivant exposure time is less than or equal to about 30 minutes. In some embodiments, the passivant exposure time is less than or equal to about 20 minutes. In some embodiments, the passivant exposure time is less than or equal to about 10 minutes. In some embodiments, the passivant exposure time is less than or equal to about 5 minutes. In some embodiments, the passivant exposure time is less than or equal to about 1 minute.

In some embodiments, an optional precleaning process is performed prior to selectively forming the at least one passivation layer (e.g., prior to exposing the base structure to the at least one passivant). The precleaning process can improve the selectivity of a supplemental dielectric layer to be formed on the first ILD layer and/or decrease the selectivity of the supplemental dielectric layer to be formed on the first conductive material. The precleaning process can include a surface clean to remove a native oxide on a surface of the at least one conductive layer. The precleaning process can further remove contaminants from the surface of the at least one conductive layer. The precleaning process can further reduce defect growth on the at least one conductive layer. For example, the precleaning process can include a thermal EtOH treatment, a hydrogen radical treatment, etc.

At step 320, at least one catalyst layer is selectively formed. More specifically, each catalyst layer is selectively formed on the ILD layer of the base structure, in preference to each conductive layer of the base structure. Each passivation layer prevents the formation of each catalyst layer on each conductive layer. Each catalyst layer can include a suitable chemistry to induce the formation of each supplemental dielectric layer. For example, each catalyst layer can include a strong reducing agent, a metal hydride, a metal alkyl, a metal aryl, a silane, etc. Each catalyst layer can be formed using one or more catalyst layer precursors. In some embodiments, each catalyst layer is a metal-catalyst layer. In some embodiment, each catalyst layer is a metalloid-catalyst layer. For example, a catalyst layer can be an Al-catalyst layer, a Ti-catalyst layer, a Hf-catalyst layer, a Zr-catalyst layer, a Ta-catalyst layer, a B-catalyst layer, a Ge-catalyst layer, a Sn-catalyst layer, a Ga-catalyst layer, an In-catalyst layer, etc. As an illustrative example, an Al-catalyst layer can include $Al_2O_3$.

In some embodiments, the at least one catalyst layer includes at least one catalyst layer monolayer. In some embodiments, the at least one catalyst layer includes at least one catalyst layer film. For example, a catalyst layer monolayer can be an Al-catalyst layer and a catalyst layer film can be an Al-containing film. In some embodiments, the Al-containing film includes $Al_2O_3$. For example, the at least one catalyst layer precursor can include at least one of an Al-precursor or an O-precursor. Examples of Al-precursors include trimethylaluminum (TMA), tris(neopentyl)aluminum (TNpAl), etc. Examples of O-precursors include water ($H_2O$), ozone ($O_3$), hydrogen peroxide ($H_2O_2$), etc.

The catalyst layer formation process can be performed using any suitable process parameters. In some embodiments, the catalyst layer formation process is performed at a temperature between about 20° C. (i.e., about room temperature) to about 600° C. In some embodiments, the catalyst layer formation process is performed at a temperature between about 100° C. to about 300° C. In some embodiments, the catalyst layer formation process is performed at a pressure between about 1 mTorr to about 760 torr (i.e., about 1 atmosphere). In some embodiments, the catalyst layer formation process is performed at a pressure between about 1 torr to about 10 torr. In some embodiments, the dose time of at least one catalyst layer precursor is between about 0.1 s per cycle to about 60 s per cycle. For example, if the at least one catalyst layer is formed as a monolayer, the dose time of the at least one catalyst layer precursor can be about 1 s to about 2 s. As another example, if the at least one catalyst layer includes a film (e.g., $Al_2O_3$) formed using a deposition process (e.g., ALD process), the dose time of each catalyst layer precursor (e.g., Al-precursor and O-precursor) can be about 0.1 s.

At step 330, at least one supplemental dielectric layer is selectively formed using the at least one catalyst layer. Each catalyst layer is used to induce the formation of each supplemental dielectric layer. For example, each catalyst layer can catalyze the growth of the at least one supplemental dielectric layer (e.g., achieve a suitably high GPC of a deposition process used to form each supplemental dielectric layer. In some embodiments, the at least one supplemental dielectric layer includes a low-k dielectric material. In some embodiments, the low-k dielectric material has a dielectric constant of less than or equal to about 4. In some embodiments, the at least one supplemental dielectric layer includes a silicate. For example, the at least one supplemental dielectric layer includes a low-k dielectric silicate (i.e., a silicate with a dielectric constant of less than or equal to about 4). Examples of low-k dielectric silicates include $SiO_x$, SiOC, etc.

The at least one supplemental dielectric layer can be formed using any suitable supplemental dielectric layer formation process. In some embodiments, the supplemental dielectric layer formation process is an ALD process. For example, the ALD process can be a thermal ALD process. The at least one supplemental dielectric layer can be formed by performing a suitable number of cycles of the passivation layer formation process, catalyst layer formation process and/or supplemental dielectric layer formation process to achieve a target thickness of the at least one supplemental dielectric layer. In some embodiments, the target thickness is between about 5 nm to about 30 nm. In some embodiments, the target thickness is between about 10 nm to about 20 nm. For example, each cycle of the catalyst layer formation process can include a catalyst layer deposition precursor pulse and a purge gas pulse. As another example, each cycle of the supplemental dielectric layer formation process can include a supplemental dielectric layer deposition precursor pulse and a purge gas pulse. A purge gas can be any suitable inert gas. For example, the purge gas can be argon gas (Ar), nitrogen gas ($N_2$), etc.

In some embodiments, the supplemental dielectric layer formation process utilizes at least one supplemental dielectric layer deposition precursor. For example, the at least one supplemental dielectric layer deposition precursor can include at least one deposition precursor that can form at least one supplemental dielectric layer including a silicate. Examples of silicates include $SiO_x$, SiOC, etc.

In some embodiments, the at least one supplemental dielectric precursor is of the form:

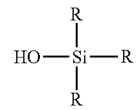

Where each R is at least one of: an alkyl or alkoxy group where the number of carbon (C) atoms is independently between 1-8, a hydrogen (H) group, an aldehyde group, a carboxyl group (e.g., carboxylic acid), an ether group, an alcohol group, a phenyl group, or other groups containing combinations of C, O and H. In some embodiments, the at least one supplemental dielectric precursor is of the form:

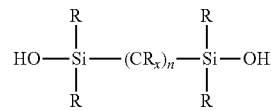

where each R is at least one of: an alkyl or alkoxy group where the number of C atoms is independently between 1-8, a hydrogen (H) group, an aldehyde group, a carboxyl group (e.g., carboxylic acid), an ether group, an alcohol group, a phenyl group, or other groups containing combinations of C, O and H, $x \in \{0,1,2\}$ and $n \in \{0,1,2,3,4,5,6\}$.

In some embodiments, the at least one supplemental dielectric layer includes $SiO_x$ and the at least one supplemental dielectric layer precursor includes an $SiO_x$ precursor. For example, the $SiO_x$ precursor can be an Al-catalyzed $SiO_x$ precursor. Examples of Al-catalyzed $SiO_x$ precursors include $Si(OH)(t-BuO)_3$, $Si(OH)(t-PeO)_3$, etc.

In some embodiments, the at least one supplemental dielectric layer includes SiOC, and the at least one supplemental dielectric layer precursor includes an SiOC precursor. For example, the SiOC precursor can be an Al-catalyzed SiOC precursor. Examples of Al-catalyzed SiOC precursors include $Si(OH)(Me)(t-BuO)_2$, $Si(OH)(Et)(t-BuO)_2$, $Si(OH)(Me)(t-PeO)_2$, $Si(OH)(Et)(t-PeO)_2$, $Si(OH)(i-Bu)(t-BuO)_2$ and $Si(OH)(i-Bu)(t-PeO)_2$. Accordingly, the SiOC precursor can form at least one supplemental dielectric layer that is doped within carbon to reduce the dielectric constant of the at least one supplemental dielectric layer.

In some embodiments, forming the at least one supplemental dielectric layer includes forming at least one base supplemental dielectric layer, and doping the at least one base supplemental dielectric layer using a doping reagent. That is, the at least one supplemental dielectric precursor can include a base supplemental dielectric layer precursor and a doping reagent. The doping reagent can be used to dope each base supplemental dielectric layer to reduce the dielectric constant. For example, the at least one base supplemental dielectric layer can be formed using the at least one $SiO_x$ precursor to form at least one base supplemental dielectric layer including $SiO_x$, and the at least one base supplemental dielectric layer can be doped using at least one doping reagent to form at least one supplemental dielectric layer including SiOC. In some embodiments, the at least one doping reagent includes a silanol reagent. Silanols are compounds with an Si—O—H functional group. Examples of silanol reagents include diethyl(isopropyl)silanol, dimethylphenylsilanol, (4-Methoxyphenyl)dimethylsilanol, diphenylsilanediol, methylsilanetriol, tert-Butyldimethylsilanol, triethylsilanol, triisopropylsilanol, trimethylsilanol, triphenylsilanol, tris(tert-butoxy)silanol, tris(tert-pentoxy)silanol, tris(trimethylsilyl)silanol, tris(Trimethylsilyloxy)silanol, tris(2-methoxyphenyl)silanol, 1,1,1,3,5,5,5-Heptamethyltrisiloxane, etc. Accordingly, in this example, SiOC can be formed by doping carbon into $SiO_x$, as opposed to forming SiOC directly.

The process parameters of the supplemental dielectric layer formation process (e.g., thermal ALD process) can depend on the supplemental dielectric layer precursor(s) used to form the supplemental dielectric layer, and a target thickness of the resulting supplemental dielectric layer. The target thickness can be achieved by performing a target number of deposition cycles. In some embodiments, the target thickness is between about 5 nm to about 30 nm. In some embodiments, the target thickness is between about 10 nm to about 20 nm. In some embodiments, the supplemental dielectric layer formation process is performed at a temperature between about 20° C. (i.e., about room temperature) to about 600° C. In some embodiments, the supplemental dielectric layer formation process is performed at a temperature between about 100° C. to about 300° C. In some embodiments, the supplemental dielectric layer formation process is performed at a pressure between about 1 mTorr to about 760 torr. In some embodiments, the supplemental dielectric layer formation process is performed at a pressure between about 1 torr to about 10 torr. A sufficiently high pressure may be needed in order to fully saturate the catalytic formation of the at least one supplemental dielectric layer. In some embodiments, the dose time of the at least one supplemental dielectric layer deposition precursor (e.g., silanol) is between about 0.1 s per cycle to about 60 s per cycle. In some embodiments, the dose time of the at least one supplemental dielectric layer deposition precursor (e.g., silanol) is between about 1 s to about 10 s.

As mentioned above, the at least one passivation layer can prevent the adsorption of the deposition precursors used to form the at least one catalyst layer and/or the at least one supplemental dielectric layer. Accordingly, due to the at least one passivation layer, dielectric material (e.g., low-k dielectric material) of negligible thickness can be formed on the at least one conductive layer during the supplemental dielectric layer deposition process (e.g., a thickness of less than about 1 nm).

In some embodiments, selectively forming the at least one passivation layer includes refreshing at least one passivation layer. More specifically, after selectively forming the at least one catalyst layer, the at least one passivation layer can be refreshed to address possible degradation of the at least one passivation layer caused by the catalyst layer formation process.

In some embodiments, an optional post-cleaning process is performed after forming the at least one supplemental dielectric layer. Performing the post-cleaning process can include removing the at least one passivation layer from surfaces of the at least one conductive layer. Performing the post-cleaning process can further include removing defects (e.g., dielectric material that may have formed on the at least one conductive layer during the deposition process).

Figure 4A:
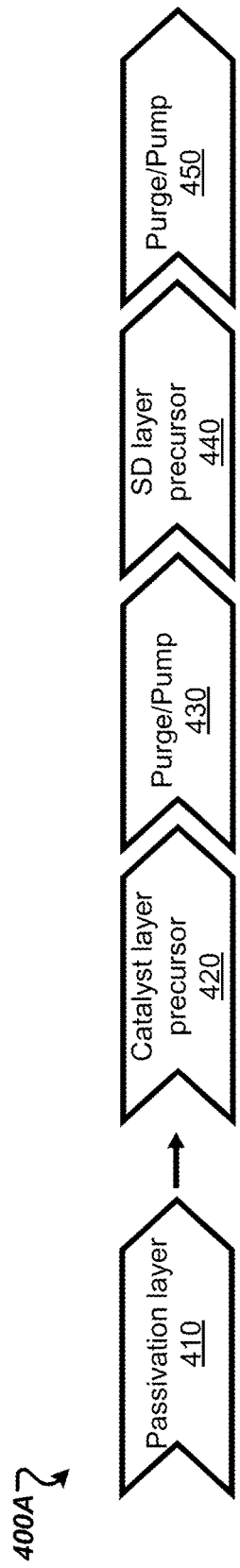

FIG. 4A is a diagram illustrating example method 400A of selectively forming at least one supplemental dielectric (SD) layer including passivation layer formation step 410, a catalyst layer formation step to form at least one catalyst layer, and a SD layer formation step to form at least one SD layer using the at least one catalyst layer. The catalyst layer formation step includes catalyst layer precursor step 420 and purge/pump step 430. In some embodiments, catalyst layer precursor step 420 is an Al-catalyst layer precursor step. The SD layer formation step includes SD layer precursor step 440 and purge/pump step 450 that form a cycle such that X cycles are performed. The number of cycles (i.e., the value of X) can be chosen such that the at least one SD layer achieves a target thickness. In some embodiments, the target thickness is between about 5 nm to about 30 nm. In some embodiments, the target thickness is between about 10 nm to about 20 nm. In some embodiments, the at least one SD layer includes a low-k dielectric material (e.g., low-k dielectric silicate). Examples of low-k dielectric materials include $SiO_x$, SiOC, etc. Accordingly, method 400A involves a single application of the passivation layer and a single application of the catalyst layer.

Figure 4B:
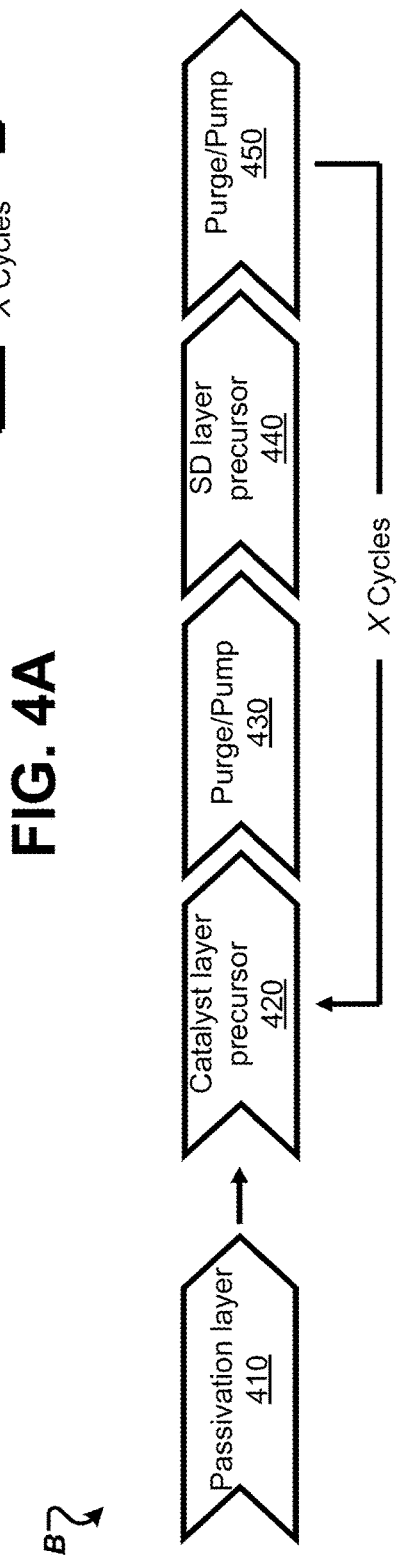

FIG. 4B is a diagram illustrating example method 400B of selectively forming at least one SD layer. Method 400B includes passivation layer formation step 410, the catalyst layer formation step including catalyst layer precursor step 420 and purge/pump step 430 to form the at least one catalyst layer, and the SD layer formation step including SD layer precursor step 440 and purge/pump step 450 to form the at least one SD layer. In this example, the catalyst layer formation step and the SD layer formation step form a cycle (i.e., the catalyst layer formation step is repeated after the SD layer formation step) such that X cycles are performed. The number of cycles (i.e., the value of X) can be chosen such that the at least one SD layer achieves a target thickness. In some embodiments, the target thickness is between about 5 nm to about 30 nm. In some embodiments, the target thickness is between about 10 nm to about 20 nm. In some embodiments, the at least one SD layer includes a low-k dielectric material (e.g., low-k dielectric silicate). Examples of low-k dielectric materials include $SiO_x$, SiOC, etc. Accordingly, method 400B involves a single application of the at least one passivation layer and multiple applications of the at least one catalyst layer.

Figure 4C:
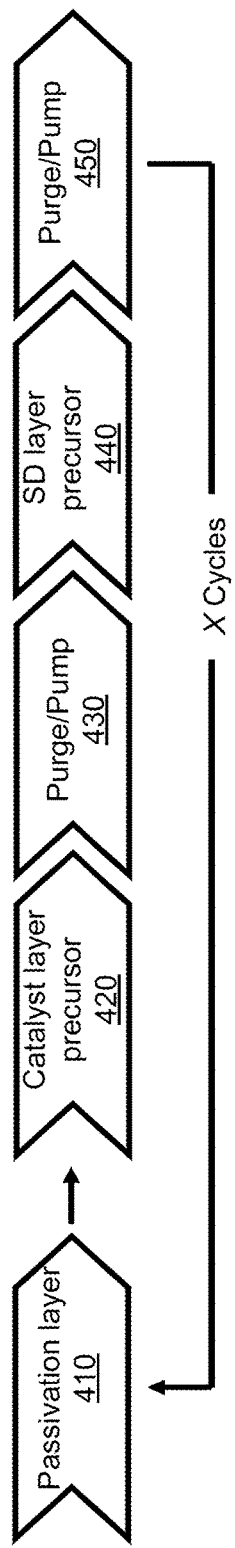

FIG. 4C is a flow diagram illustrating example method 400C of selectively forming at least one SD layer. Method 400C includes passivation layer formation step 410, the catalyst layer formation step including catalyst layer precursor step 420 and purge/pump step 430 to form the at least one catalyst layer, and the SD layer formation step including SD layer precursor step 440 and purge/pump step 450 to form the at least one SD layer.

In this example, the passivation layer step, the catalyst layer formation step and the SD layer formation form a cycle (i.e., the passivation layer formation step is repeated after the SD layer formation step) such that X cycles are performed. The number of cycles (i.e., the value of X) can be chosen such that the at least one SD layer formed during the SD layer formation step achieves a target thickness. In some embodiments, the target thickness is between about 5 nm to about 30 nm. In some embodiments, the target thickness is between about 10 nm to about 20 nm. In some embodiments, the at least one SD layer includes a low-k dielectric material (e.g., low-k dielectric silicate). Examples of low-k dielectric materials include $SiO_x$, SiOC, etc. Accordingly, method 400C involves multiple applications of the at least one passivation layer and multiple applications of the at least one catalyst layer.

FIG. 4D is a flow diagram illustrating example method 400D of selectively forming at least one SD layer. Method 400D includes a passivation layer (PL) formation step 410 to form the at least one PL, a first catalyst layer (CL) formation step to form at least one first CL, a second CL layer formation step to form at least one second CL, and the SD layer formation step including SD layer precursor step 440 and purge/pump step 450 to form the at least one SD layer. More specifically, the first CL formation step includes CL precursor 1 step 420-1, purge/pump step 430-1, CL precursor 2 step 420-2 and purge/pump step 430-2. The second CL formation step includes CL precursor 3 step 420-3 and purge/pump step 430-3. In some embodiments, CL precursor 3 step 420-3 is the same as CL precursor 1 step 420-1. For example, the CL precursor 3 step 420-3 can be performed to alkylate the surface of the at least one first CL.

In this example, steps 420-1 through 430-2 of the first CL formation step form a first cycle such that $X_1$ cycles of the first cycle are performed. Moreover, steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step, and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the at least one SD layer includes a low-k dielectric material (e.g., low-k dielectric silicate). Examples of low-k dielectric materials include $SiO_x$, SiOC, etc. Accordingly, method 400D involves a single application of the at least one PL, multiple applications of the at least one first CL, a single application of the at least one second CL, and multiple applications of the at least one SD layer.

FIG. 4E is a flow diagram illustrating example method 400E of selectively forming at least one SD layer. Method 400E includes PL formation step 410 to form the at least one PL, the first CL formation step including steps 420-1 through 430-2 to form the at least one first CL, the second CL layer formation step including steps 420-3 and 430-3 to form the at least one second CL, and the SD layer formation step including steps 440 and 450 to form the at least one SD layer.

In this example, steps 420-1 through 430-2 of the first CL formation step form a first cycle such that $X_1$ cycles of the first cycle are performed. Moreover, steps 420-3 and 430-3 of the second CL formation step and steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step, and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the SD layer formation step forms at least one SD layer including a low-k dielectric material (e.g., low-k dielectric silicate). Examples of low-k dielectric materials include $SiO_x$, SiOC, etc. Accordingly, method 400E involves a single application of the at least one PL, and multiple applications of the at least one first CL, the at least one second CL, and the at least one SD layer (e.g., the at least one second CL is refreshed after each SD layer formation cycle).

FIG. 4F is a flow diagram illustrating example method 400F of selectively forming at least one SD layer. Method 400F includes PL formation step 410 to form the at least one PL, the first CL formation step including steps 420-1 through 420-2 to form the at least one first CL, the second CL layer formation step including steps 420-3 and 430-3 to form the at least one second CL, and the SD layer formation step including steps 440 and 450 to form the at least one SD layer.

In this example, PL formation step 410, steps 420-1 through 430-2 of the first CL formation step form a first cycle such that $X_1$ cycles of the first cycle are performed. Moreover, steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the SD layer formation step forms at least one SD layer including a low-k dielectric material (e.g., low-k dielectric silicate). Examples of low-k dielectric materials include $SiO_x$, SiOC, etc. Accordingly, method 400F involves a single application of the at least one second CL, and multiple applications of the at least one passivation layer, the at least one first CL, the at least one second CL, and the at least one SD layer (e.g., the at least one PL is refreshed after each first/second CL layer formation cycle).

FIG. 4G is a flow diagram illustrating example method 400G of selectively forming at least one SD layer. Method 400G includes PL formation step 410 to form the at least one PLM, the first CL formation step including steps 420-1 through 420-2 to form the at least one first CL, the second CL layer formation step including steps 420-3 and 430-3 to form the at least one second CL, and the SD layer formation step including steps 440 and 450 to form the at least one SD layer.

In this example, PL formation step 410, steps 420-1 through 430-2 of the first CL formation step form a first cycle such that $X_1$ cycles of the first cycle are performed. Moreover, steps 420-3 and 430-3 of the second CL layer formation step and steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the SD layer formation step forms at least one SD layer including a low-k dielectric material (e.g., low-k dielectric silicate). Examples of low-k dielectric materials include $SiO_x$, SiOC, etc. Accordingly, method 400G involves a single application of the at least one PL, and multiple applications of the at least one first CL, the at least one second CL, and the at least one SD layer (e.g., the second CL is refreshed after each SD layer formation cycle).

FIG. 4H is a flow diagram illustrating example method 400H of selectively forming at least one SD layer. Method 400H includes PL formation step 410 to form the at least one PL, the first CL formation step including steps 420-1 through 420-2 to form the at least one first CL, the second CL layer formation step including steps 420-3 and 430-3 to form the at least one second CL, and the SD layer formation step including steps 440 and 450 to form the at least one SD layer.

In this example, steps 420-1 through 430-2 of the first CL formation step form a first cycle such that $X_1$ cycles of the first cycle are performed. In this example, an additional PL formation step 410 is performed after performing the $X_1$ cycles of the first cycle (e.g., the at least one PL is refreshed). Moreover, steps 420-3 and 430-3 of the second CL formation step and steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the SD layer formation step forms at least one SD layer including a low-k dielectric material (e.g., low-k dielectric silicate). Examples of low-k dielectric materials include $SiO_x$, SiOC, etc. Accordingly, method 400H involves a single application of the at least one PL before the first CL formation step, a single application of the at least one PL after the first CL formation step, and multiple applications of the at least one first CL, the at least one second CL, and the at least one SD layer (e.g., the at least one second CL is refreshed after each SD layer formation cycle).

FIG. 4I is a flow diagram illustrating example method 400I of selectively forming at least one SD layer. Method 400I includes PL formation step 410 to form the at least one PL, the first CL formation step including steps 420-1 through 420-2 to form the at least one first CL, the second CL layer formation step including steps 420-3 and 430-3 to form the at least one second CL, and the SD layer formation step including steps 440 and 450 to form the at least one SD layer.

In this example, PL formation step 410, steps 420-1 through 430-2 of the first CL formation step form a first cycle such that $X_1$ cycles of the first cycle are performed. In this example, an additional PL formation step 410 is performed after performing the $X_1$ cycles of the first cycle (e.g., the at least one PL is refreshed). Moreover, the additional PL formation step 410 and steps 420-3 and 430-3 of the second CL formation step and steps 440 and 450 of the SD layer formation step form a second cycle such that $X_2$ cycles of the second cycle are performed. In some embodiments, the at least one first CL includes $Al_2O_3$ and the at least one second CL includes an Al-catalyst layer. For example, CL precursor 1 step 420-1 can be an Al-catalyst layer precursor step, CL precursor 2 step 420-2 can be an O-catalyst layer precursor step and CL precursor 3 step 420-3 can be another Al-catalyst layer precursor step. The number of cycles (i.e., the values of $X_1$ and $X_2$) can be chosen such that the at least one CL formed during the first CL formation step and the at least one SD layer formed during the SD layer formation step achieve a target thickness. In some embodiments, the target thickness is between about 5 nm to about 30 nm. In some embodiments, the target thickness is between about 10 nm to about 20 nm. In some embodiments, the SD layer formation step forms at least one SD layer including a low-k dielectric material (e.g., low-k dielectric silicate). Examples of low-k dielectric materials include $SiO_x$, SiOC, etc. Accordingly, method 400I involves multiple applications of the at least one PL before the first CL formation step (e.g., the at least one PL is refreshed after each first CL formation cycle), and multiple applications of the at least one PL layer after the first CL formation step, the at least one first CL, the at least one second CL, and the at least one SD layer (e.g., the at least on PL and the least one second CL are refreshed after each SD layer formation cycle).

Figure 5:
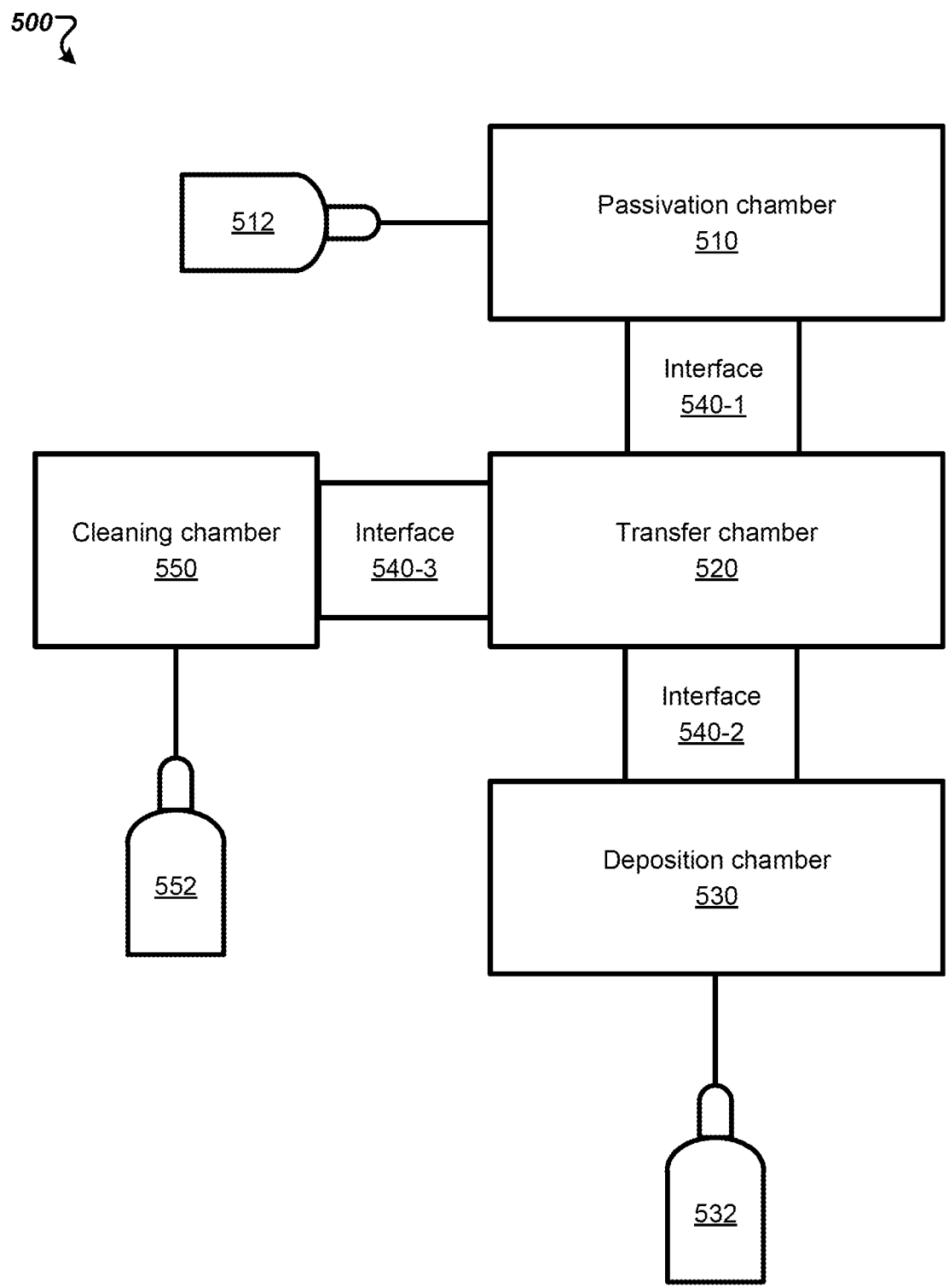
FIG. 5 is a block diagram of an example electronic device processing system that can be used to fabricate an electronic device using area-selective deposition, in accordance with some embodiments.

FIG. 5 is a block diagram of an example electronic device processing system ("system") 500 that can be used to fabricate an electronic device using area-selective deposition, in accordance with some embodiments. For example, system 500 can be used to form device 100 described above with reference to FIGS. 1A-1D. As another example, system 500 can implement methods 200-400I described above with reference to FIGS. 2-4I.

As shown, system 500 includes passivation chamber 510, transfer chamber 520, and deposition chamber 530. Interface 540-1 can be disposed between passivation chamber 310 and transfer chamber 520, and interface 540-2 can be disposed between transfer chamber 520 and deposition chamber 530. In some embodiments, interfaces 540-1 and 540-2 are respective gate valves. Transfer chamber 520 can include a transfer robot (not shown). Transfer chamber 520, passivation chamber 510, and deposition chamber 530 may each be maintained under vacuum in controlled conditions (e.g., with little or no humidity). Although not shown, system 500 can further include at least one load lock chamber and at least one factory interface to enable the movement of substrates from atmosphere to transfer chamber 520. Accordingly, substrates may be transferred between chambers without breaking vacuum, and thus without exposing a substrate to air and/or humidity.

Passivation chamber 510 can passivate at least one conductive layer of a base structure by exposing the at least one conductive layer to a passivant. Passivation chamber 510 can be operatively coupled to at least one store 512. In some embodiments, at least one store 512 includes at least one passivant store for storing at least one passivant. In some embodiments, the at least one passivant store stores a vapor-phase passivant. In some embodiments, the at least one passivant store stores a solution-phase passivant. At least one store 512 can further include at least one purge gas store for storing any suitable inert gas(es) for purging passivation chamber 512 during the passivation process (e.g., Ar or $N_2$). Further details regarding passivating the conductive material with a passivant are described above with reference to FIGS. 1B and 2-4I.

Deposition chamber 530 can be operatively coupled to at least one store 532. Deposition chamber 530 can perform a deposition process to form a catalyst layer selectively on the first ILD layer and/or a deposition process to form a supplemental dielectric layer selectively on the first ILD layer. At least one store 532 can include at least one deposition precursor store. The at least one deposition precursor store can store any suitable deposition precursor(s) for forming a catalyst layer and/or a supplemental dielectric layer. At least one store 532 can further include a purge gas store for storing any suitable inert gas(es) for purging deposition chamber 530 during a deposition process (e.g., Ar or $N_2$). After passivating the at least one conductive layer, the transfer robot can, in some embodiments, transfer the electronic device to deposition chamber 530. Further details regarding performing a deposition process to form a catalyst layer selectively on the first ILD layer and/or a deposition process to form a supplemental dielectric layer selectively on the first ILD layer are described above with reference to FIGS. 1C-D and 2-4I.

In some embodiments, the deposition process is performed in passivation chamber 510 (i.e., passivation chamber 510 is a process chamber configured to perform the passivation process and the deposition process). In these embodiments, at least one store 532 is operatively coupled to passivation chamber 510. In some embodiments, the passivation process is performed in deposition chamber 530 (i.e., deposition chamber 530 is a process chamber configured to perform the passivation process and the deposition process). In these embodiments, at least one store 512 is operatively coupled to deposition chamber 530.

In some embodiments, system 500 can optionally include cleaning chamber 550 to perform an optional cleaning process before passivation (i.e., precleaning process) and/or an optional cleaning process after the formation of the supplemental dielectric layer (i.e., post-cleaning process). Interface 540-3 can be disposed between cleaning chamber 550 and transfer chamber 520. In some embodiments, cleaning chamber 550 is an in-situ cleaning chamber, and interface 540-3 is a gate valve. In some embodiments, cleaning chamber 550 is an ex-situ cleaning chamber, and interface 540-3 is a load lock chamber. Cleaning chamber 550 can be operatively coupled to at least one store 552. At least one store 552 can include any suitable cleaning chemistry for performing precleaning and/or post-cleaning. At least one store 552 can further include a purge gas store for storing suitable inert gas(es) for purging cleaning chamber 552 (e.g., Ar or $N_2$) during a cleaning process. In some embodiments, the precleaning process can be performed in the same chamber as passivation (e.g., passivation chamber 510 or deposition chamber 530). In these embodiments, at least one store 552 can be operatively coupled to passivation chamber 510 and/or deposition chamber 530. In some embodiments, the post-cleaning process can be performed in passivation chamber 510 and/or deposition chamber 530. In these embodiments, at least one store 552 can be operatively coupled to passivation chamber 510 and/or deposition chamber 530. Further details regarding performing cleaning processes (e.g., precleaning process and/or post-cleaning process) are described above with reference to FIG. 2. Further electronic device processing, as described above with reference to FIGS. 1E-2, can be performed using one or more of the chambers 510-530 and 550.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:
1. A method comprising:
selectively forming at least one passivation layer on at least one first conductive layer disposed in a first interlevel dielectric (ILD) layer;

selectively forming at least one catalyst layer on the at least one passivation layer, wherein the at least one passivation layer prevents formation of the at least one catalyst layer on the first conductive layer; and selectively forming at least one supplemental dielectric layer using the at least one catalyst layer, wherein the at least one catalyst layer induces formation of the at least one supplemental dielectric layer, and wherein the at least one supplemental dielectric layer comprises a dielectric material having a dielectric constant of less than or equal to about 4.

2. The method of claim 1, wherein selectively forming the at least one passivation layer comprises forming the at least one passivation layer using a vapor-phase passivant.

3. The method of claim 1, wherein selectively forming the at least one passivation layer comprises forming the at least one passivation layer using a solution-phase passivant.

4. The method of claim 1, wherein the at least one catalyst layer comprises at least one of: a metal-catalyst layer or a metalloid-catalyst layer.

5. The method of claim 4, wherein selectively forming the at least one supplemental dielectric layer comprises forming the at least one supplemental dielectric layer using a catalyzed precursor.

6. The method of claim 1, wherein the at least one supplemental dielectric layer comprises a silicate.

7. The method of claim 6, wherein the silicate comprises at least one of: a silicon oxide ($SiO_x$) or a silicon oxycarbide (SiOC).

8. The method of claim 1, wherein the at least one supplemental dielectric layer has a thickness of about 10 nm to about 20 nm.

9. The method of claim 1, further comprising:
forming a second ILD layer over the at least one supplemental dielectric layer and the at least one first conductive layer; and
forming, in the second ILD layer, at least one second conductive layer in contact with the at least one first conductive layer.

10. The method of claim 9, wherein the at least one first conductive layer comprises a first via, and the at least one second conductive layer comprises a second via in contact with the first via.

11. A system comprising at least one chamber operatively coupled to at least one store, the at least one chamber being configured to:
selectively form at least one passivation layer on at least one first conductive layer disposed in a first interlevel dielectric (ILD) layer;
selectively form at least one catalyst layer on the at least one passivation layer, wherein the at least one passivation layer prevents formation of the at least one catalyst layer on the first conductive layer; and
selectively form at least one supplemental dielectric layer using the at least one catalyst layer, wherein the at least one catalyst layer induces formation of the at least one supplemental dielectric layer, and wherein the at least one supplemental dielectric layer comprises a dielectric material having a dielectric constant of less than or equal to about 4.

12. The system of claim 11, wherein the at least one store maintains at least one of: a vapor-phase passivant for selectively forming the at least one passivation layer, or a solution-phase passivant for selectively forming the at least one passivation layer.

13. The system of claim 11, wherein the at least one store maintains at least one catalyst layer precursor for selectively forming the at least one catalyst layer.

14. The system of claim 11, wherein the at least one catalyst layer comprises at least one of: a metal-catalyst layer or a metalloid-catalyst layer.

15. The system of claim 11, wherein the at least one chamber is configured to form the at least one supplemental dielectric layer using a catalyzed precursor.

16. The system of claim 11, wherein the at least one supplemental dielectric layer comprises a silicate, wherein the at least one store maintains a silanol, and wherein the at least one chamber is configured to form the at least one supplemental dielectric layer using the silanol as a deposition precursor.

17. The system of claim 16, wherein the silicate comprises at least one of: a silicon oxide ($SiO_x$) or a silicon oxycarbide (SiOC).

18. The system of claim 11, wherein the at least one supplemental dielectric layer has a thickness between about 10 nm to about 20 nm.

19. The system of claim 11, wherein the at least one chamber is further configured to:
form a second ILD layer over the at least one supplemental dielectric layer and the at least one first conductive layer; and
form, within the second ILD layer, at least one second conductive layer in contact with the at least one first conductive layer.

20. The system of claim 19, wherein the at least one first conductive layer comprises a first via, and the at least one second conductive layer comprises a second via in contact with the first via.

* * * * *